(12) United States Patent
Arisumi et al.

(10) Patent No.: US 7,884,413 B2
(45) Date of Patent: Feb. 8, 2011

(54) SEMICONDUCTOR DEVICE

(75) Inventors: Osamu Arisumi, Yokohama (JP); Masahiro Kiyotoshi, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 251 days.

(21) Appl. No.: 12/219,880

(22) Filed: Jul. 30, 2008

(65) Prior Publication Data

US 2009/0206409 A1    Aug. 20, 2009

Related U.S. Application Data

(62) Division of application No. 11/439,993, filed on May 25, 2006, now Pat. No. 7,416,955.

(30) Foreign Application Priority Data

Jun. 7, 2005    (JP)    ............... 2005-166949

(51) Int. Cl.
    *H01L 29/788*    (2006.01)
(52) U.S. Cl. .............. 257/315; 257/316; 257/368; 257/506; 257/E27.06
(58) Field of Classification Search ............... 257/315, 257/316, 368, 506, E27.06
    See application file for complete search history.

(56) References Cited

U.S. PATENT DOCUMENTS

| 5,448,111 | A | * | 9/1995 | Ohkura et al. | ............ 257/724 |
| 5,492,858 | A |   | 2/1996 | Bose et al. |  |
| 6,191,002 | B1 |  | 2/2001 | Koyanagi |  |
| 6,346,490 | B1 | * | 2/2002 | Catabay et al. | ............ 438/795 |
| 6,368,911 | B2 | * | 4/2002 | Fu | ............ 438/248 |
| 7,052,971 | B2 |  | 5/2006 | Nishiyama et al. |  |
| 7,060,559 | B2 |  | 6/2006 | Ozawa et al. |  |
| 7,238,587 | B2 |  | 7/2007 | Hoshi et al. |  |
| 7,270,886 | B2 |  | 9/2007 | Lee et al. |  |
| 2003/0089045 | A1 | * | 5/2003 | Nakayama et al. | ............ 51/308 |
| 2004/0072429 | A1 |  | 4/2004 | Hieda et al. |  |
| 2005/0263827 | A1 |  | 12/2005 | Shiba et al. |  |

FOREIGN PATENT DOCUMENTS

| JP | 8-236502 | 9/1996 |
| JP | 9-260491 | 10/1997 |
| JP | 2002-524848 | 8/2002 |
| JP | 2003-258082 | 9/2003 |

OTHER PUBLICATIONS

Notice of Reasons for Rejection mailed by the Japanese Patent Office on Dec. 8, 2009, for Japanese Patent Application No. 2005-166949 and English-language translation thereof.

* cited by examiner

*Primary Examiner*—Tuan N. Quach
(74) *Attorney, Agent, or Firm*—Finnegan, Henderson, Farabow, Garrett & Dunner, L.L.P.

(57) ABSTRACT

A method of manufacturing a semiconductor device, includes forming a first insulating film containing silicon oxide as a main ingredient, on an underlying region, adhering water to the first insulating film, forming a polymer solution layer containing a silicon-containing polymer on the water-adhered first insulating film, and forming a second insulating film containing silicon oxide as a main ingredient from the polymer solution layer, wherein forming the second insulating film includes forming silicon oxide by a reaction between the polymer and water adhered to the first insulating film.

5 Claims, 8 Drawing Sheets

SEMICONDUCTOR DEVICE

CROSS-REFERENCE TO RELATED APPLICATIONS

This application is a division of application Ser. No. 11/439,993, filed May 25, 2006, U.S. Pat. No. 7,416,995 which claims priority from prior Japanese Patent Application No. 2005-166949, filed Jun. 7, 2005, the entire contents of both are incorporated herein by reference.

BACKGROUND OF THE INVENTION

1. Field of the Invention

The present invention relates to a semiconductor device and a method of manufacturing the same.

2. Description of the Related Art

As the downsizing of semiconductor devices progresses, it becomes difficult to reliably fill an isolation trench with an insulating film. As a solution to such a problem, there has been proposed a method that utilizes a perhydrosilazane polymer (to be called polysilazane hereinafter). (See, for example, Jpn. Pat. Appln. KOKAI Publication No. 2003-258082.) In this method, a polysilazane solution is applied, and the resultant is subjected to coating, baking, curing and densifying processes, etc., thereby obtaining a silicon oxide film ($SiO_2$ film).

Alternatively, there is a technical idea of using a stack film made of a silicon oxide film formed by a CVD (chemical vapor deposition) method (to be called CVD silicon oxide film), and a silicon oxide film obtained from polysilazane (to be called polysilazane silicon oxide film). However, in this case, the polysilazane film is not sufficiently converted into $SiO_2$ film, and therefore the following problem may occur.

A polysilazane silicon oxide film has an etching rate higher as compared to that of a CVD silicon oxide film. Therefore, when etching a stack film of a polysilazane silicon oxide film and a CVD silicon oxide film in the isolation trench, the etching of the polysilazane silicon oxide film progresses faster and therefore a desired etched form cannot be obtained. Thus, due to such a poor controllability of the etching, the etching amount varies from one place to another depending on the pattern, which creates a problem.

Further, the polysilazane silicon oxide film exhibits a large film contraction in a high-temperature heat process such as the curing or densifying process, and therefore a large stress is created. As a result, the peeling-off of the film easily occurs, which serves as a large factor for lowering the yield.

Furthermore, some of the carbon atoms and nitrogen atoms contained in the polysilazane solution remain in the film, which cause an adverse effect on the properties of the semiconductor device. More specifically, carbon atoms and nitrogen atoms are piled up on the side walls and bottom surface of the isolation trench to create a space charge, thereby significantly varying the shift amount of the field inversion voltage of the transistor ($\Delta Vfb$).

As described above, in a stack film made of a CVD silicon oxide film and a polysilazane silicon oxide film, the polysilazane film is not sufficiently converted into $SiO_2$ film, which causes such problems as a poor controllability of the etching, a large stress created in the film and degradation of electrical properties. Therefore, it is conventionally difficult to form an insulating film of excellent properties and reliability.

BRIEF SUMMARY OF THE INVENTION

According to a first aspect of the present invention, there is provided a method of manufacturing a semiconductor device, comprising: forming a first insulating film containing silicon oxide as a main ingredient, on an underlying region; adhering water to the first insulating film; forming a polymer solution layer containing a silicon-containing polymer on the water-adhered first insulating film; and forming a second insulating film containing silicon oxide as a main ingredient from the polymer solution layer, wherein forming the second insulating film includes forming silicon oxide by a reaction between the polymer and water adhered to the first insulating film.

According to a second aspect of the present invention, there is provided a semiconductor device, comprising: an underlying region; a first insulating film containing silicon oxide as a main ingredient, formed on the underlying region; a second insulating film containing silicon oxide as a main ingredient, formed on the first insulating film, wherein the second insulating film includes a granular portion containing silicon oxide in a vicinity of the first insulating film.

DETAILED DESCRIPTION OF THE INVENTION

An embodiment of the present invention will now be described with reference to accompanying drawings. The embodiment will be described in connection with a NAND-type flash memory, which is an electrically erasable nonvolatile semiconductor memory device.

Figure 1:
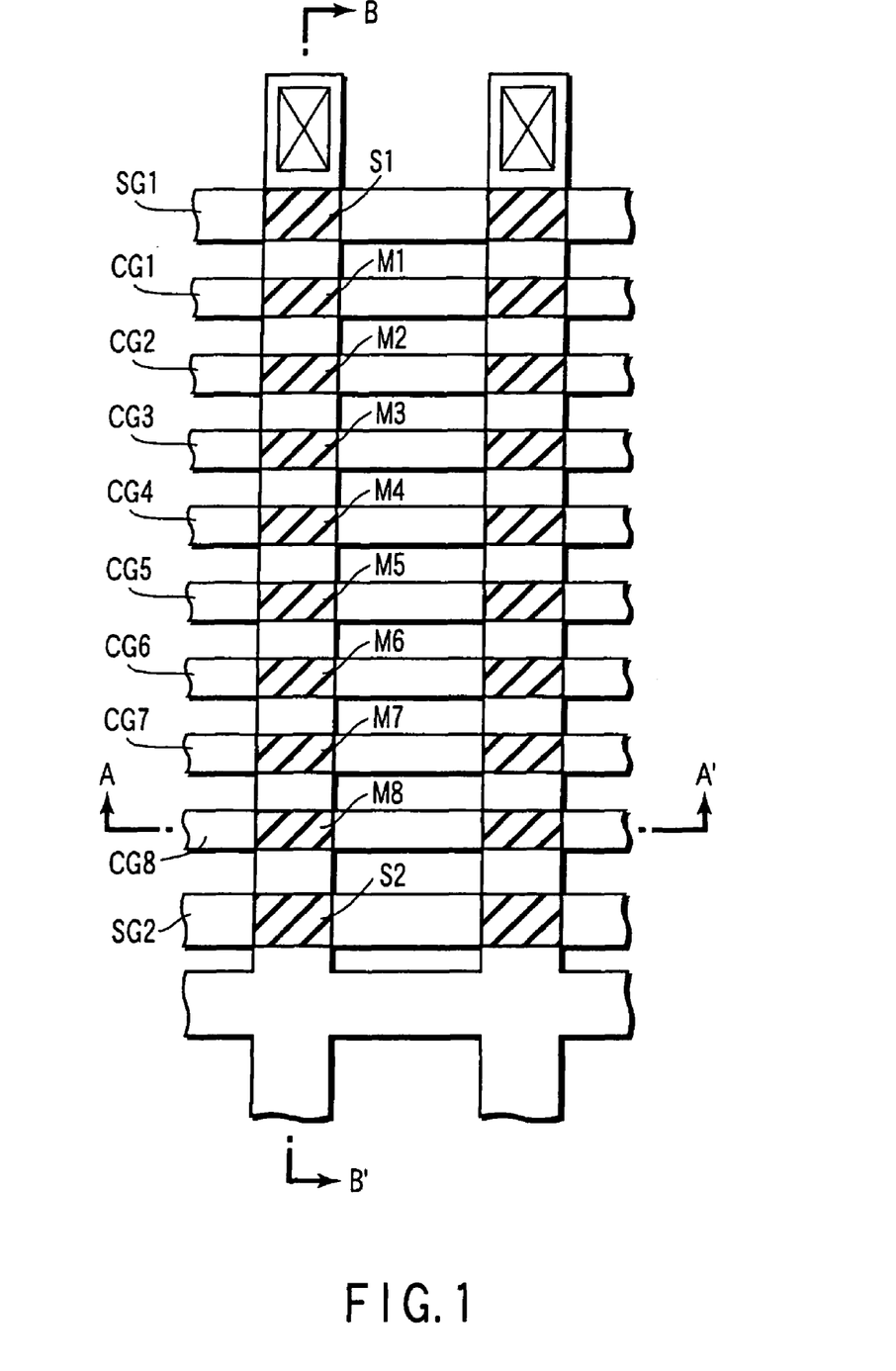
FIG. 1 is a plan view schematically showing the structure of a semiconductor device according to an embodiment of the present invention.
Figure 2:
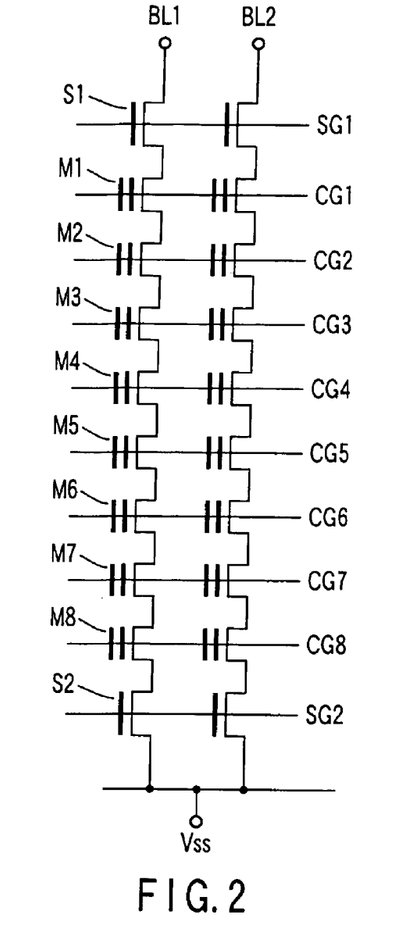
FIG. 2 is a diagram showing an equivalent circuit to the semiconductor device according to the embodiment of the present invention.

FIG. 1 is a plan view schematically showing a brief structure of a NAND-type flash memory according to an embodiment (note that bit lines are not illustrated). FIG. 2 is a diagram showing an equivalent circuit to the structure shown in FIG. 1.

As shown in FIGS. 1 and 2, each of NAND cell units has such a structure that memory cells M1 to M8 are provided between select transistors S1 and S2. Select gate lines SG1 and SG2 are connected respectively to the select transistors S1 and S2, and control gate lines (word lines) CG1 to CG8 are connected respectively to the memory cells M1 to M8. Further, bit lines BL1 and BL2 are connected to each of the select transistors S1. It should be noted here that this embodiment will be described in connection with a case where there are 8 memory cells, but the number of cells is not limited to 8.

Figure 3:
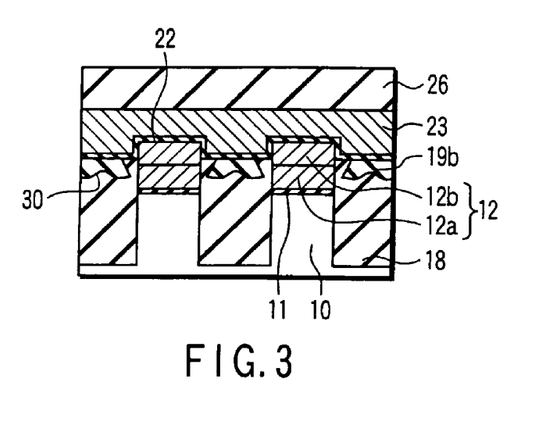
FIG. 3 is a cross sectional view schematically showing the structure of the semiconductor device according to the embodiment of the present invention.
Figure 4:
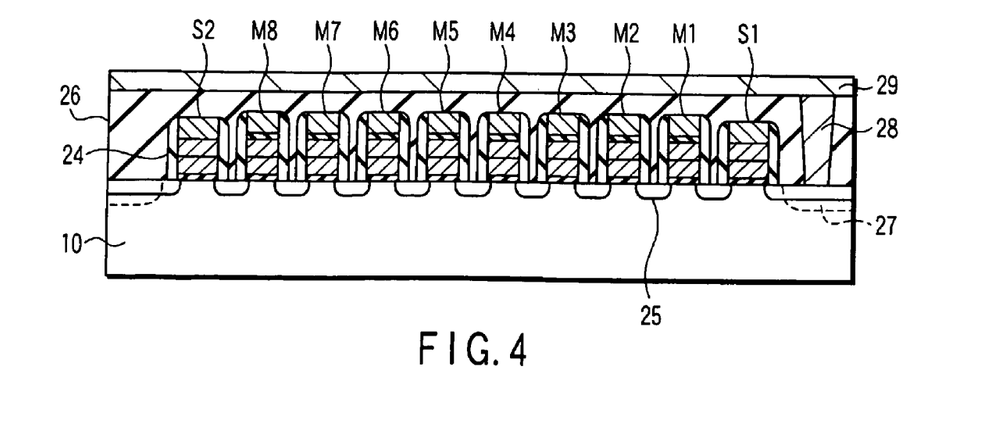
FIG. 4 is a cross sectional view schematically showing the structure of the semiconductor device according to the embodiment of the present invention.

FIG. 3 is a cross sectional view taken along the line A-A' of FIG. 1 (that is, a cross section in a word line direction), and FIG. 4 is a cross sectional view taken along the line B-B' of FIG. 1 (that is, a cross section in a bit line direction).

As shown in FIGS. 3 and 4, the select transistors S1 and S2 and the memory cells M1 to M8 are formed on the silicon substrate (semiconductor substrate) 10.

Each of the memory cells M1 to M8 includes a tunnel insulating film (first gate insulating film) 11 formed on the silicon substrate 10, a floating gate electrode film (first gate electrode film) 12 formed of polysilicon films 12a and 12b, an inter-electrode insulating film (second gate insulating film) 22 formed of an ONO (oxide/nitride/oxide) film, and a control gate electrode film (second gate electrode film) 23. Each of the select transistors S1 and S2 includes a gate insulating film 11 formed on the silicon substrate 10, and a gate electrode formed of the polysilicon films 12a and 12b and the control gate electrode film 23. A sidewall spacer 24 is formed on sidewalls of each of the select transistors S1 and S2 and the memory cells M1 to M8. A source/drain diffusion layer 25 is formed between memory cells adjacent to each other in the bit line direction.

Figure 5:
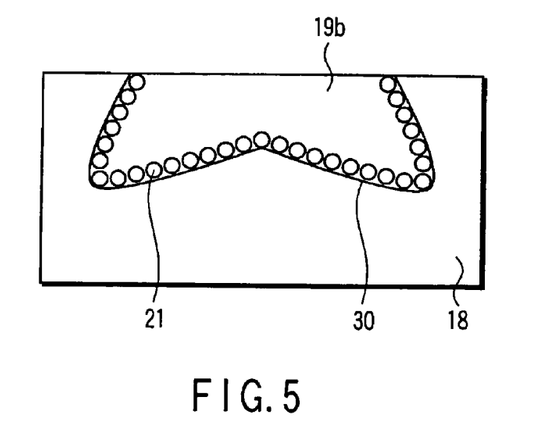
FIG. 5 is a cross sectional view showing a part of the structure of the semiconductor device according to the embodiment of the present invention.

An isolation insulating portion that contains silicon oxide as its main component is formed between the NAND cell units located adjacent to each other in the word line direction. The isolation insulating portion is made of a silicon oxide film (CVD silicon oxide film: first insulating film) 18 formed by a CVD method and a silicon oxide film (polysilazane silicon oxide film: second insulating film) 19b obtained from a perhydrosilazane polymer (polysilazane). As shown in FIG. 5, in the vicinity of a boundary 30 between the CVD silicon oxide film 18 and the polysilazane silicon oxide film 19b, the polysilazane silicon oxide film 19b includes a granular portion 21 formed of a silicon oxide. The granular portion 21 contains carbon, and the carbon concentration of the granular portion 21 is higher than that of the portion other than the granular portion 21 of the polysilazane silicon oxide film 19b. In other words, in the polysilazane silicon oxide film 19b, the carbon concentration of the region close to the boundary between the CVD silicon oxide film 18 and the polysilazane silicon oxide film 19b is higher than that of the other regions.

The select transistors, memory cells and the like are covered with an interlayer insulating film 26. Further, a high-concentration diffusion layer 27 is formed in a surface region of the silicon substrate 10, and a bit line 29 is connected to the high-concentration diffusion layer 27 via a contact plug 28.

A method of manufacturing the NAND-type flash memory described above will now be described with reference to FIGS. 6 to 18. It should be noted here that FIGS. 6 to 18 correspond to cross sections taken along the line A-A' in FIG. 1.

Figure 6:
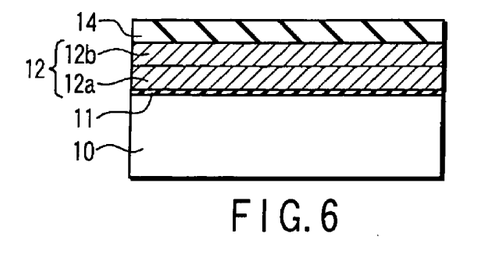
FIGS. 6 to 18 each are a cross sectional view schematically showing a method of manufacturing the semiconductor device according to the embodiment of the present invention.
Figure 7:
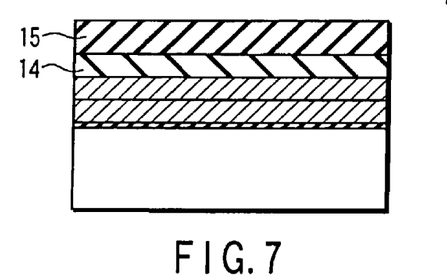

First, as shown in FIG. 6, a silicon oxide film ($SiO_2$ film) having a thickness of about 10 nm is formed as the tunnel insulating film 11 on the silicon substrate (semiconductor substrate) 10. Then, polysilicon films 12a and 12b having a total thickness of about 150 nm is formed as the floating gate electrode film 12 on the tunnel insulating film 11. Further, a silicon nitride film ($Si_3N_4$ film) having a thickness of about 100 nm, which is for use in pad is formed on the polysilicon film 12b. After that, as shown in FIG. 7, a mask film 15 is formed on the silicon nitride film 14.

Figure 8:
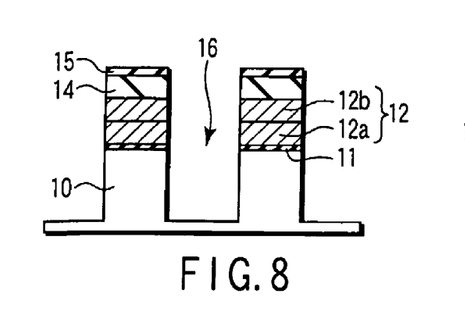

Next, as shown in FIG. 8, the mask film 15 is patterned, and with use of the patterned mask film 15 as the mask, the silicon nitride film 14, the floating gate electrode film 12, the tunnel insulating film 11, the silicon substrate 10 are patterned by an RIE (reactive ion etching) method. Thus, an isolation trench 16 having a depth of about 450 nm for use of STI (shallow trench isolation) is formed.

It should be noted that it is alternatively possible though it is not illustrated in the figure that the surface of the isolation trench 16 is oxidized by a normal thermal oxidization method to form a thermal oxidation film having a thickness of about 3 nm after the step shown in FIG. 8. With this thermal oxidization film, the exposed portion of the edge of the tunnel insulating film 11 can be protected. Further, it is possible to form an oxide film on the surface of the isolation trench 16 by a radical oxidizing method. With use of the radical oxidizing method, it is possible to form an oxide film with uniform properties, which is not dependent on the plane orientation of silicon. Furthermore, the side surfaces of the silicon nitride film 14 may be slightly oxidized.

Figure 9:
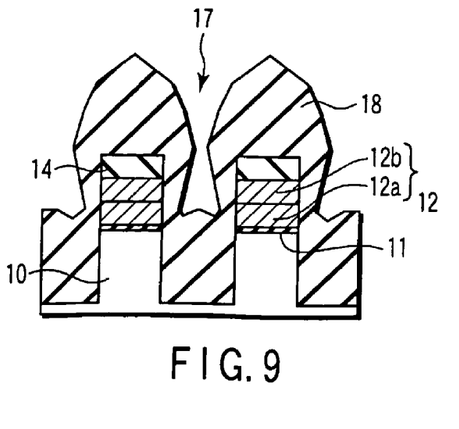

Next, as shown in FIG. 9, the CVD silicon oxide film (first insulating film) 18 is deposited by an HDP (high density plasma)—CVD (chemical vapor deposition) method on an underlying region obtained by the process shown in FIG. 8. With this process, the isolation trench 16 is not completely filled with the CVD silicon oxide film 18, and the CVD silicon oxide film 18 has a recess portion 17 created due to the isolation trench 16. It should be noted that the height from an interface between the silicon substrate 10 and the tunnel insulating film 11 to the bottom surface of the recess portion 17 should be set to, for example, at least about 80 nm.

Figure 10:
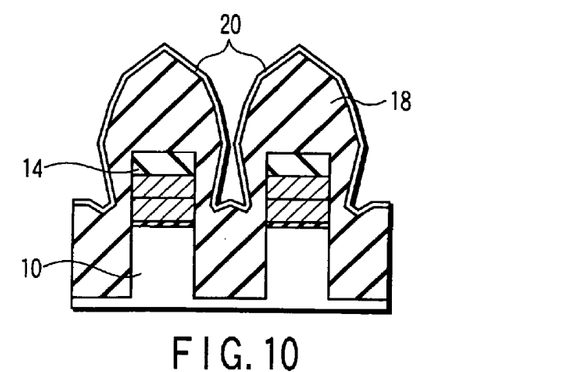

Next, as shown in FIG. 10, water is adhered onto the surface of the CVD silicon oxide film 18, thereby forming a water layer 20. The formation of the water layer 20 is conducted, for example, in the following manner. That is, first, a substrate having a structure illustrated in FIG. 9 is placed in a refrigerator and it is maintained in a cooled state. For example, the cooling temperature is set to −5° C., and the cooling time period is set to 15 minutes or longer. After that, the cooled substrate is taken out of the refrigerator to release it from the cooled state. After taking the substrate out of the refrigerator, it is held in a carrier box or the like, in which the temperature and humidity are controlled to 20° C. and 60%, respectively, for about 10 minutes. Thus, condensation occurs on the surface of the CVD silicon oxide film 18, thereby forming the water layer 20. It should be noted that a cooling plate that uses a cryo-pump, liquid nitrogen or the like, may be used to cool down the substrate.

Figure 11:
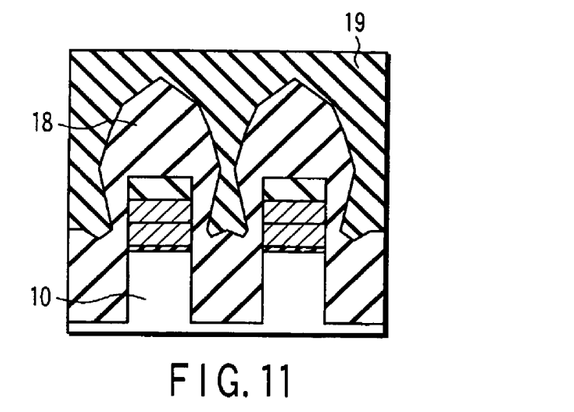

Next, as shown in FIG. 11, a perhydrosilazane polymer solution layer (polysilazane solution layer) 19 is formed as a polymer solution layer that contains a silicon-containing polymer, on the water-adhered CVD silicon oxide film 18. More specifically, the CVD silicon oxide film 18 is coated with the polysilazane solution by spin coating to have a thickness of 600 nm on a flat surface region.

Figure 12:
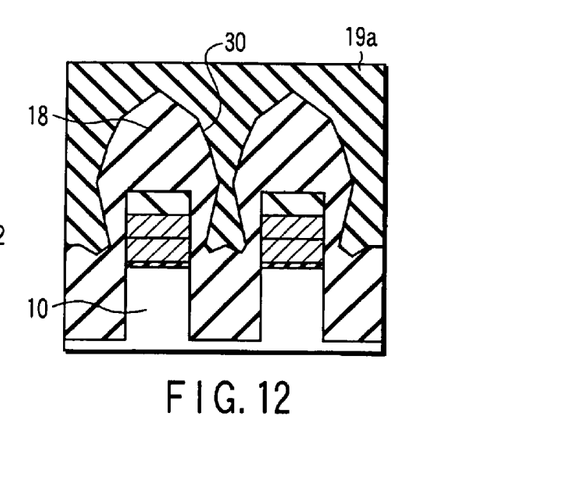

Next, as shown in FIG. 12, the solvent contained in the polysilazane solution layer 19 is volatilized by the baking process, thereby forming the perhydrosilazane polymer film (polysilazane film) 19a. The conditions for the baking process are, for example, a temperature of 80 to 150° C. and a time period of 3 minutes. The recess portion 17 of the CVD silicon oxide film 18 is completely filled with the polysilazane film 19a.

Further, the substrate on which the polysilazane film 19a is formed is let stand, for example, at room temperature for 1 hour or more. As a result, polysilazane reacts with water to produce a silicon oxide in the vicinity of the boundary 30 between the CVD silicon oxide film 18 and the polysilazane film 19a. That is, since polysilazane reacts extremely easily with water, polysilazine is converted into silicon oxide ($SiO_2$) due to the self-bridging property of polysilazane. The conversion of polysilazane into silicon oxide starts already before the baking process. Here, the conversion of polysilazane into silicon oxide is further promoted by maintaining the substrate at room temperature. It should be noted that the polysilazane film 19a contains a remainder of dibutylether, which is the solvent, but dibutylether is hydrophobic, and therefore it will never mix with water.

When the silicon oxide is produced as described above, the granular portion containing silicon oxide is formed in the vicinity of the boundary 30 between the CVD silicon oxide film 18 and the polysilazane film 19a. In the granular portion, carbon contained in the solvent of the polysilazane solution layer 19 is captured. In other words, the granular portion is formed while capturing carbon contained in the polysilazane solution layer 19. Consequently, in the region close to the boundary between the CVD silicon oxide film 18 and the polysilazane film 19a, the carbon concentration is higher than that of the other region. The above-described phenomenon will now be described in detail.

Figure 19:
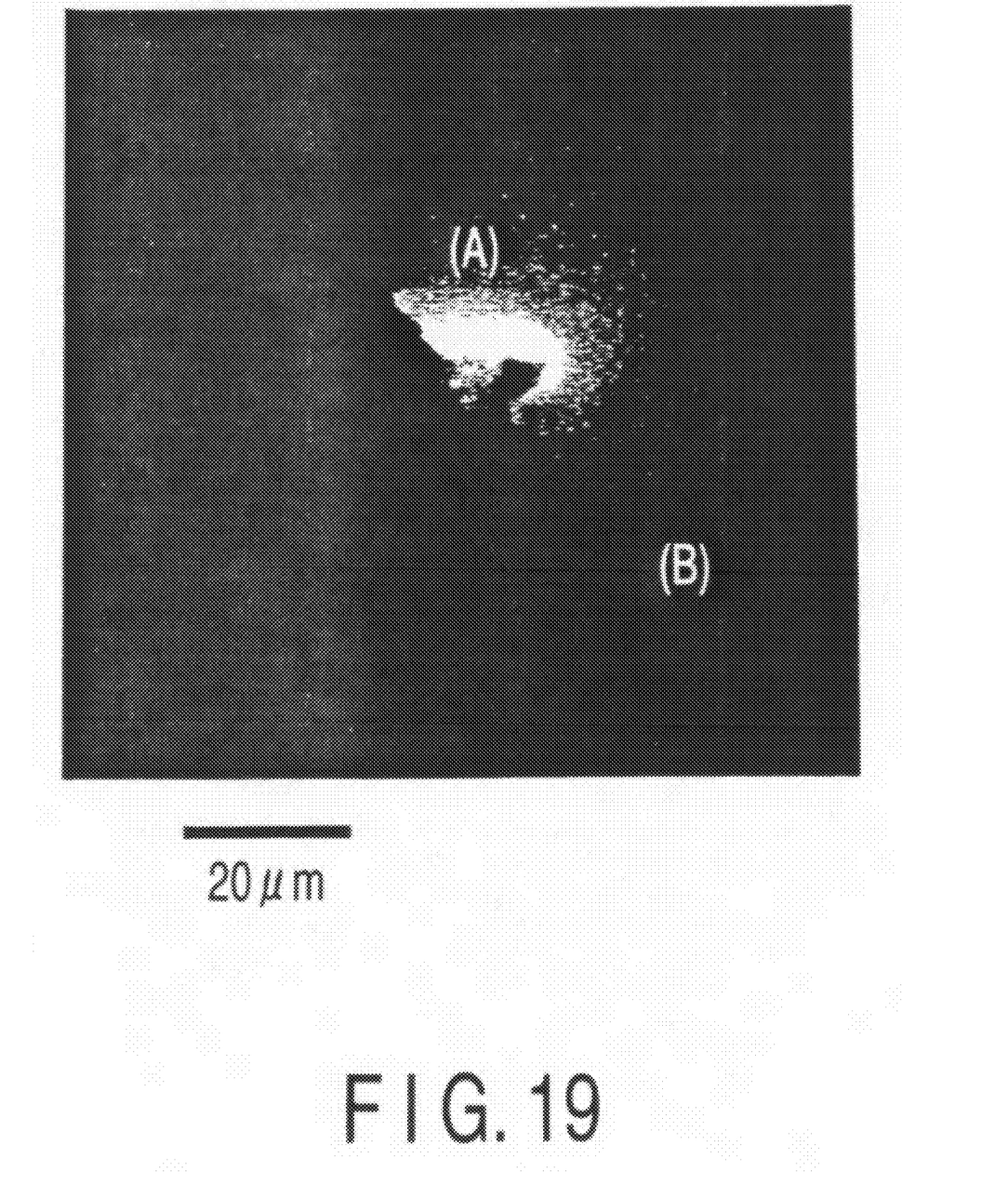
FIG. 19 is a photograph of a foreign matter formed on a silicon wafer, taken with an electron microscope.

As shown in the SEM photograph of FIG. 19, if water is present on the surface of the silicon substrate while applying the polysilazane solution on the silicon substrate, a gel-like foreign matter is formed on the surface of the silicon substrate.

Figure 20A:
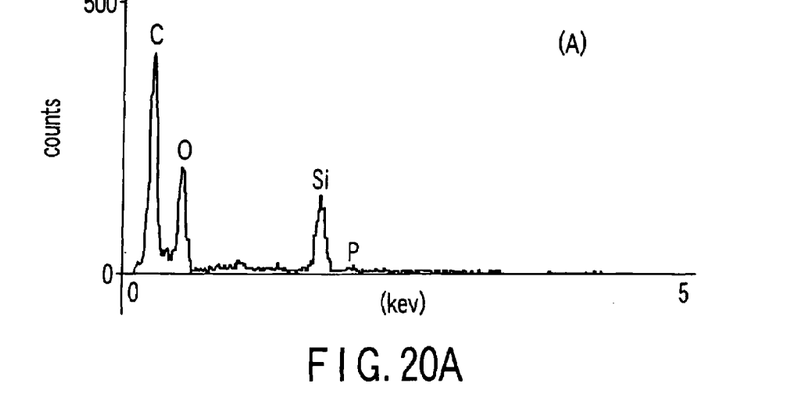
FIGS. 20A, 20B and 20C each are a diagram illustrating the result of SEM-EDX analysis on the surface region of the silicon wafer.
Figure 20B:
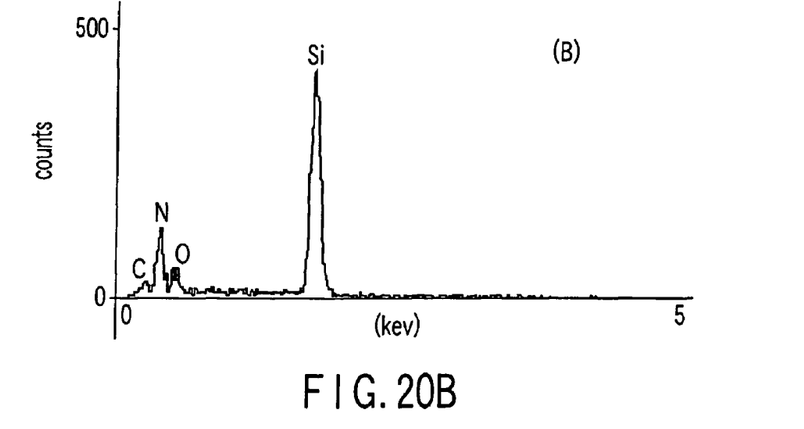
Figure 20C:
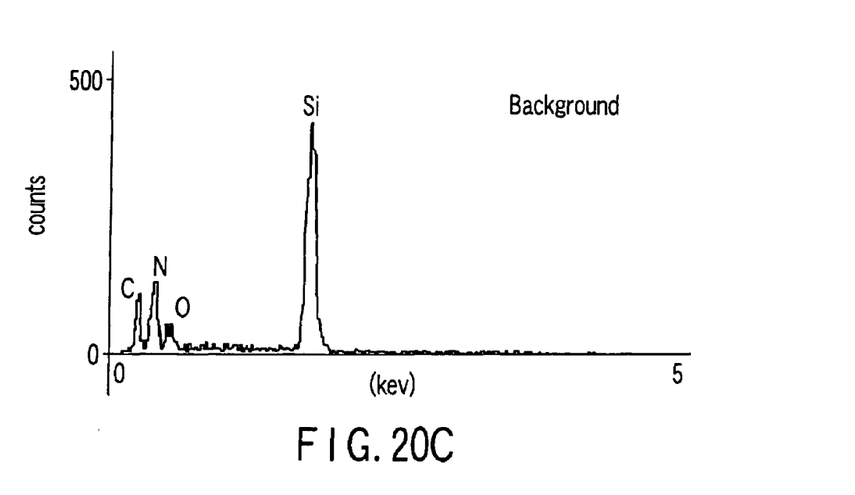

FIGS. 20A, 20B and 20C each are a diagram illustrating the result of SEM-EDX analysis on the surface region of the silicon wafer shown in FIG. 19. FIG. 20A shows the result of the analysis at a position where the foreign matter is formed (position A), FIG. 20B shows the result of the analysis at a position close to the foreign matter (position B), and FIG. 20C shows the result of the analysis at a position far from the foreign matter (background). At the position where the foreign matter is formed shown in FIG. 20A, the peak for carbon (C) is significantly high as compared to the case shown in FIG. 20C. On the other hand, at the position close to the foreign matter shown in FIG. 20B, the peak for carbon (C) is low as compared to the case shown in FIG. 20C. This fact indicates that the foreign matter is formed while capturing carbon located in the vicinity of the foreign matter. Therefore, it is considered that the granular portion containing silicon oxide is formed due to the foreign matter.

As can be understood from the description provided above, when water is adhered in advance onto the surface of the CVD silicon oxide film, carbon contained in the polysilazane solution can be captured while producing the granular portion due to the reaction between polysilazane and water. In other words, it is possible to collect carbon present in the vicinity of the boundary between the CVD silicon oxide film and the polysilazane film. Further, silica conversion is accelerated at the interface between CVD silicon oxide film and the polysilazane film. Accordingly, substitution reaction between nitrogen and oxygen occurs remarkably in the polysilazane film near the interface, and ammonia is removed from the film. AS a result, it is possible to lower the nitrogen concentration in the film. In this manner, such a problem can be prevented that carbon atoms are piled up on the side and bottom surfaces of the isolation trench to create a space charge, thereby significantly varying the shift amount (ΔVfb) of the field inversion voltage of the transistor.

Figure 21:
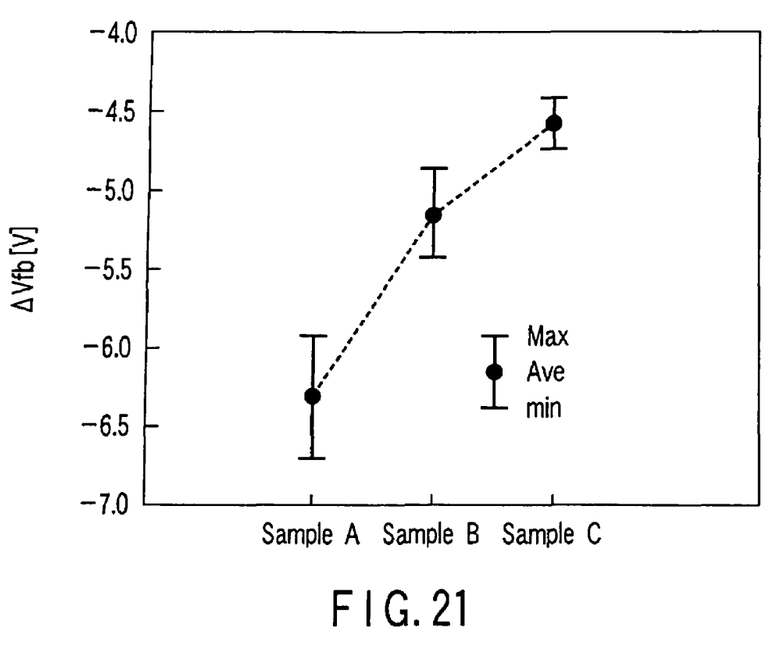
FIG. 21 is a diagram illustrating the result of evaluation of C-V characteristics of MIS capacitors having various types of insulating films.

FIG. 21 is a diagram illustrating the result of evaluation of a C-V characteristics of each of various types of MIS capacitors each having such a structure that an insulating film is formed on a conductive silicon substrate and a polysilicon electrode is formed on the insulating film. Sample A (comparative example) and sample B (embodiment of the present invention) indicate cases where a stack of an HDP-CVD silicon oxide film (having a thickness of 170 nm) and a polysilazane silicon oxide film (having a thickness of 400 nm) was used as an insulating film. An only difference between these cases is that the condensation treatment was not carried out on the HDP-CVD silicon oxide film in Sample A, whereas the condensation treatment was carried out onto the HDP-CVD silicon oxide film in Sample B. Sample C indicates a case where a single-layer film of an HDP-CVD silicon oxide film having a thickness of 570 nm was used as an insulating film. As shown in FIG. 21, the sample of the embodiment of the present invention (that is, Sample B) exhibited a shift amount ΔVfb of the flat band voltage and a variation of ΔVfb which were significantly improved as compared to those of the sample of the comparative example (that is, Sample A), to become closer to the characteristics of the single-layer film of HDP-CVD silicon oxide film (Sample C).

In the meantime, an HDP-CVD silicon oxide film was formed on the surface of a silicon substrate, and the HDP-CVD silicon oxide film was subjected to the condensation treatment. After that, a polysilazane silicon oxide film having a thickness of 600 nm was formed, and thus a sample was prepared. The obtained sample was subjected to a SIMS (secondary ion mass spectroscopy) analysis. In the SIMS analysis, sputtering is carried out from the back surface of the substrate (backside-SIMS). The results of the analysis indicated that carbon peak, which was not found in the prior art, was detected in the interface between the HDP-CVD silicon oxide film and the polysilazane silicon oxide film. Although nitrogen peak corresponding to pile-up at the interface appears in an ordinary case, it is remarkably lowered in the above sample.

As can be understood from the technical fact described above, when the water adhesion treatment (condensation treatment) is performed onto the surface of the CVD silicon oxide film in advance, carbon atoms can be effectively collected in the boundary between the CVD silicon oxide film and the polysilazane silicon oxide film.

Figure 13:
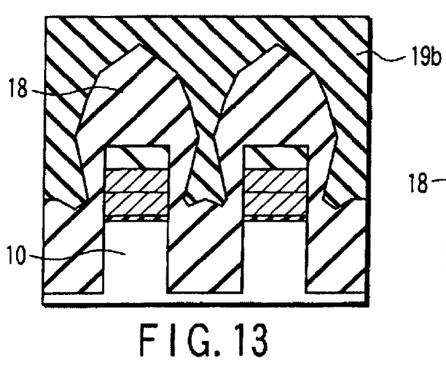

After the step shown in FIG. 12, a curing process is carried out as shown in FIG. 13. With this curing process, the polysilazane film 19a is converted into the polysilazane silicon oxide film 19b. More specifically, a high-temperature heat process is carried out under an atmosphere of water vapor. With the heat process, the following reaction occurs:

To explain, polysilazane reacts with oxygen (O) created by decomposition of water vapor ($H_2O+O_2$), to produce $SiO_2$ (silicon oxide: silica) and $NH_3$ (ammonia). It should be noted here that the surface of the device region is covered by the silicon nitride film 14, and therefore it is not oxidized.

In the curing process described above, the conversion of polysilazane into silicon oxide takes place in the surface side of the polysilazane film 19a. In addition, since condensation process is performed on the surface of the CVD silicon oxide film 18, the conversion takes place from the boundary between the CVD silicon oxide film 18 and the polysilazane film 19a, as well. In this manner, it is possible to sufficiently convert polysilazane into silicon oxide. For example, when pyrogenic oxidation is carried out in an atmosphere of water vapor at a temperature of 850° C. for about 30 minutes, it is possible to fully convert polysilazane into silicon oxide.

Figure 22:
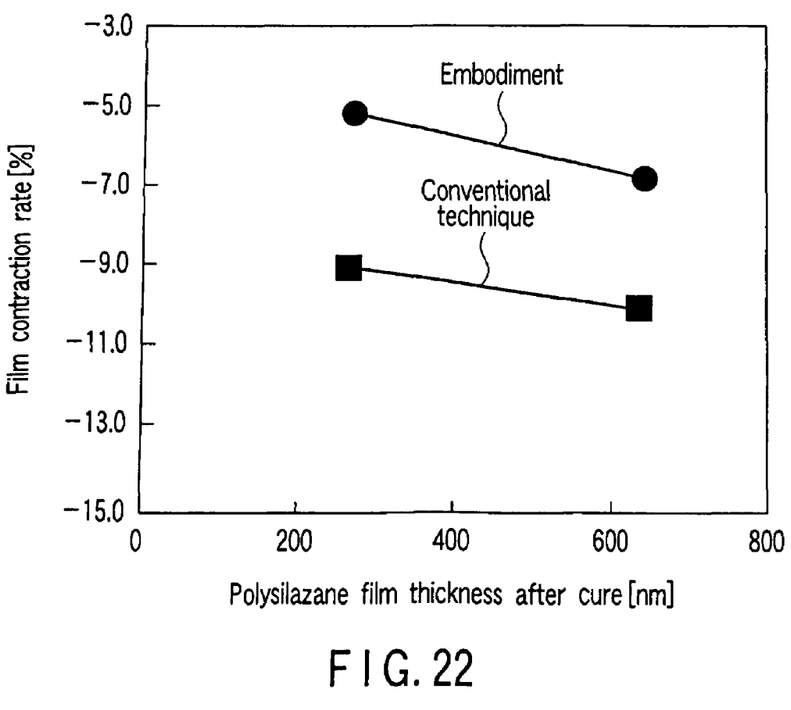
FIG. 22 is a diagram illustrating the result of measurement of the rate of film contraction caused by the curing process.

FIG. 22 is a diagram illustrating the result of measurement of the rate of film contraction caused by the curing process. With the conventional technique (without a condensation treatment), the film contraction rate caused by the curing process is about 10%, whereas with the method of the embodiment of the present invention (with a condensation treatment), the film contraction rate caused by the curing process is about 5 to 6%. With the conventional method without a condensation treatment, low-molecular components of polysilazane present in the polysilazane film easily volatilizes during the curing process, and therefore the film contraction rate is high. With the method of the embodiment of the present invention, the bridging reaction of polysilazane has been proceeding before the curing process because of the presence of water. Therefore, it is considered that the low-molecular components of polysilazane is not easily released during the curing process. Thus, the embodiment of the present invention has a low film contraction rate caused by the curing process, and therefore it is possible to relax the stress in the curing process more as compared to the case of the prior art technique, thereby preventing peeling-off of the film.

Further, in this embodiment, the granular portion that contains silicon oxide is formed due to the presence of water as mentioned above. The granular portion can absorb the stress created during the film contraction. Therefore, the stress during the curing process can be relaxed in this regard as well. Further, after carrying out the curing process, the granular portion can serve to relax the internal stress, and therefore the peeling-off of the film can be prevented even better.

Figure 23:
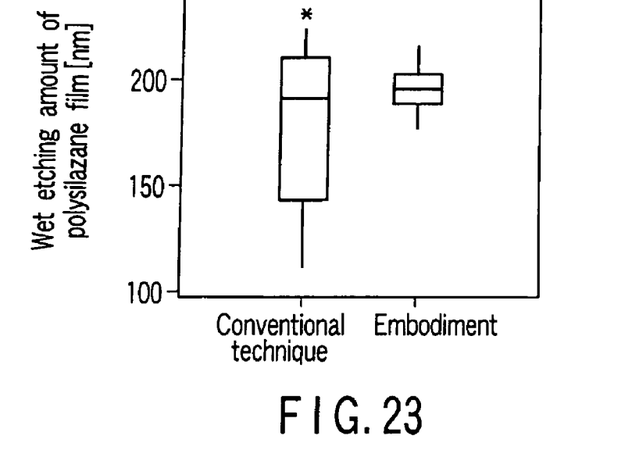
FIG. 23 is a diagram illustrating the result of evaluation of variation in the etching amount in a vicinity of an isolation trench.

FIG. 23 is a diagram illustrating, by box plots, the result of evaluation of variation in the etching amount in a vicinity of an isolation trench when carrying out wet-etching on the cured sample with use of a hydrofluoric acid-based (HF-based) etching solution. As is understood from this diagram, the variation in the etching amount is significantly reduced by the method of this embodiment (with condensation process) as compared to the prior art method (without condensation process). With the method of this embodiment, oxidation takes place from both of the upper and lower sides of the polysilazane film during the curing process. Therefore, it is considered that polysilazane is evenly converted into silicon oxide, thereby reducing the variation in etching amount.

Figure 14:
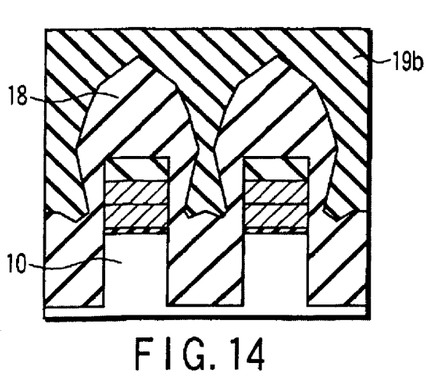

After the step shown in FIG. 13, the cured polysilazane silicon oxide film 19b is subjected to the densifying process as shown in FIG. 14. For example, a heat process at a temperature of about 850° C. is carried out in an atmosphere of oxidizing gas or inert gas, and thus $NH_3$ and $H_2O$ remaining in the polysilazane silicon oxide film 19b are released therefrom, thereby making it possible to obtain a silicon oxide film of a higher density. At the same time, the CVD silicon oxide film 18 is densified as well. Here, the surface of the element region is covered by the silicon nitride film 14, and therefore it is not oxidized. It should be noted that the desnsifying process may be carried out using an ordinary furnace or by means of RTA (rapid thermal annealing). When employing the RTA, the heat process is carried out, for example, at a temperature of 900° C. and for about 20 seconds.

In the curing or densifying process described above, it is generally not possible to carry out the heat process at a temperature exceeding 850° C. for a long period of time. If the heat process is carried out under such conditions, a bird's beak is created at an end portion of the tunnel oxide film. In other words, there is a limitation to the heat processing temperature while converting polysilazane into silicon oxide. For this reason, the polysilazane film cannot be fully converted into a silicon oxide film with the prior art method, thereby making the etching rate of the polysilazane silicon oxide film 19b higher as compared to the case of the CVD silicon oxide film 18. With the method of this embodiment, oxidation takes place from both of the upper and lower sides of the polysilazane film. Consequently, the polysilazane film can be fully converted into an silicon oxide film, and the etching rate of the polysilazane silicon oxide film 19b can be made closer to that of the CVD silicon oxide film 18.

In the conversion of a polysilazane film into an silicon oxide film, the depth that the oxidizer reaches varies generally depending on the width of the isolation trench. With the conventional method, the oxidation is carried out only from the upper side of the polysilazane film, and therefore the film quality of the insulating film formed in the isolation trench is dependent on the width of the pattern. By contrast, with the method of this embodiment, the oxidation takes place in both of the upper and lower sides of the polysilazane film. Therefore, it is possible to form an insulating film of a uniform quality in the isolation trench without depending on the pattern width.

Figure 15:
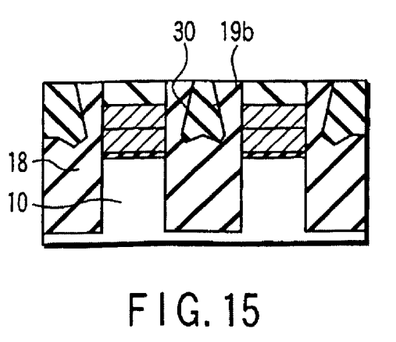

After the step shown in FIG. 14, the CVD silicon oxide film 18 and the polysilazane silicon oxide film 19b are planarized by CMP (chemical mechanical polishing) as shown in FIG. 15. In the CMP, the silicon nitride film 14 serves as a stopper. When the CMP is carried out with use of a polisher made of colloidal silica as its base material, the polishing rate of the silicon nitride film 14 to that of the CVD silicon oxide film 18 and the polysilazane silicon oxide film 19b can be set to 50 or more.

Figure 16:
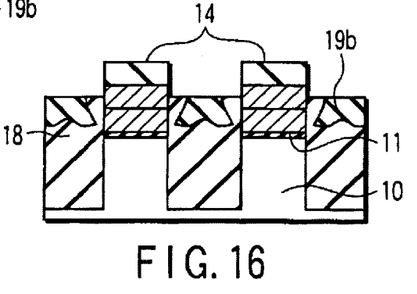

Next, as shown in FIG. 16, the CVD silicon oxide film 18 and the polysilazane silicon oxide film 19b are etched back using an hydrofluoric acid (HF)-based etching solution.

As already mentioned, with the prior art method, the polysilazane film cannot be fully converted into the silicon oxide film, and therefore the etching rate of the polysilazane silicon oxide film 19b becomes higher as compared to the case of the CVD silicon oxide film 18. Consequently, the etch-back process cannot be conducted in an even manner, thereby creating such problems that part of the CVD silicon oxide film 18 remains along the side walls of the isolation trench and the depth of the etch-back varies from one place to another.

With the method of this embodiment, the polysilazane film can be fully converted into the silicon oxide film, and therefore the etching rate of the polysilazane silicon oxide film 19b can be made close to that of the CVD silicon oxide film 18. More specifically, the etching rate ratio can be reduced to, for example, 1.5 or less. Consequently, the etch-back process can be conducted in an even manner, thereby making it possible to have the CVD silicon oxide film 18 and the polysilazane silicon oxide film 19b remaining in the isolation trench at a desired even height.

Figure 17:
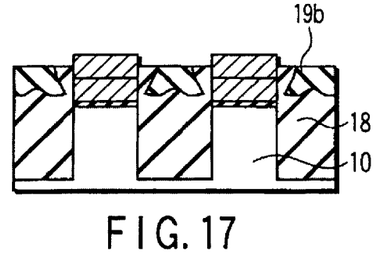

Next, as shown in FIG. 17, the silicon nitride film 14 is removed using a hot phosphoric acid solution as the etching solution.

Figure 18:
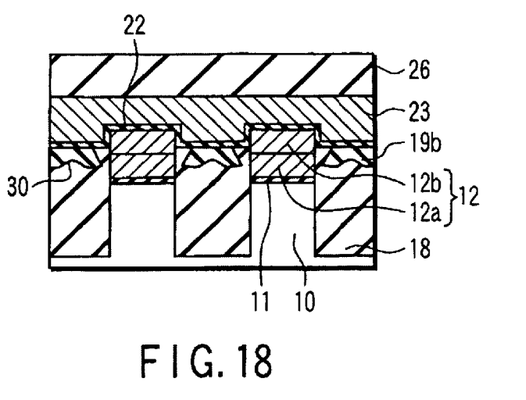

Subsequently, as shown in FIG. 18, the inter-electrode insulating film 22 made of an ONO film is formed on the surface of the floating gate electrode film 12 and the surface of the isolation portion made of the CVD silicon oxide film 18 and the polysilazane silicon oxide film 19b. Then, the control gate electrode film 23 is formed on the inter-electrode insulating film 22. Further, the tunnel insulating film 11, the floating gate electrode film 12, the inter-electrode insulating film 22 and the control gate electrode film 23 are patterned in a direction perpendicular to the extending direction of the isolation trench. In this manner, a gate structure formed of the tunnel insulating film 11, the floating gate electrode film 12, the inter-electrode insulating film 22 and the control gate electrode film 23 is obtained. Further, a source-drain diffusion layer (not shown) is formed and then the interlayer insulating film 26 is formed.

For the non-volatile memory cell, the capacitance ratio (coupling ratio) between a capacitance C1 based on the tunnel insulating film 11 and a capacitance C2 based on the inter-electrode insulating film 22 is very important. As shown in FIG. 18, the inter-electrode insulating film 22 is formed on the upper surface and side surfaces of the floating gate electrode film 12, it is important to accurately control the height of the upper surface of the isolation insulating portion to increase the accuracy of the capacitance C2. As already mentioned, with use of the method of this embodiment, it is possible to accurately control the height of the upper surface of the isolation insulating portion, and therefore the variation of the capacitance ratio can be reduced.

Although the steps after that are not illustrate in the figure, contacts, wirings, etc. are formed, and thus a NAND-type flash memory is formed.

As described above, according to this embodiment, water is adhered onto the CVD silicon oxide film (first insulating film) and the polysilazane solution layer is formed on the water-adhered CVD silicon oxide film. With this structure, silicon oxide is formed not only on the upper surface side but also on the lower surface side during the formation of the polysilazane silicon oxide film (second insulating film). Consequently, polysilazane can be fully converted into silicon oxide, thereby making it possible to form a polysilazane silicon oxide film with less variation and uniform quality. Therefore, the etching rate of the polysilazane silicon oxide film can be made close to that of the CVD silicon oxide film. Consequently, when forming the isolation portion in the isolation trench, the height of the upper surface of the isolation portion can be accurately controlled.

Further, according to this embodiment, due to the reaction between the water adhered to the CVD silicon oxide film and polysilazane contained in the polysilazane solution layer, silicon oxide is already formed in the vicinity of the boundary between the CVD silicon oxide film and the polysilazane film before carrying out a high-temperature heat process such as the curing process. Therefore, the film contraction caused by the high-temperature heat process such as curing process can be reduced, and therefore it is possible to relax the stress created during the conversion of the polysilazane film into the silicon oxide film. Further, in this embodiment, the granular portion that contains silicon oxide is formed in the vicinity of the CVD silicon oxide film due to the presence of water adhered to the CVD silicon oxide film. The granular portion can absorb the stress created during the film contraction. Therefore, the stress during a high-temperature heat process such as the curing process can be relaxed. Further, after carrying out the curing process and desnsifying process, the granular portion can serve to relax the internal stress in the vicinity of the boundary between the CVD silicon oxide film and the polysilazane silicon oxide film. In this manner, the peeling-off of the film caused by the stress can be prevented with this embodiment.

Further, according to this embodiment, the granular portion that contains silicon oxide can capture carbon atoms contained in the polysilazane solution layer. Therefore, it is possible to collect carbon atoms in the vicinity of the boundary between the CVD silicon oxide film and the polysilazane silicon oxide film. In this manner, such a problem can be prevented that carbon atoms are piled up in the interface between the CVD silicon oxide film and the underlying region. Therefore, it is possible to suppress the adverse effect of carbon on the semiconductor device. Further, silica conversion is accelerated at the interface between CVD silicon oxide film and the polysilazane film. Accordingly, substitution reaction between nitrogen and oxygen occurs remarkably in the polysilazane film near the interface, and ammonia is removed from the film. AS a result, it is possible to lower the nitrogen concentration in the film.

In the embodiment described above, there is only one step of forming the polysilazane solution layer on the CVD silicon oxide film, but it is alternatively possible to carry out the step of forming the polysilazane solution layer two times or more. The method of such a case where the step of forming the polysilazane solution layer is carried out two times or more will now be described with reference to FIGS. 24 and 25.

Figure 24:
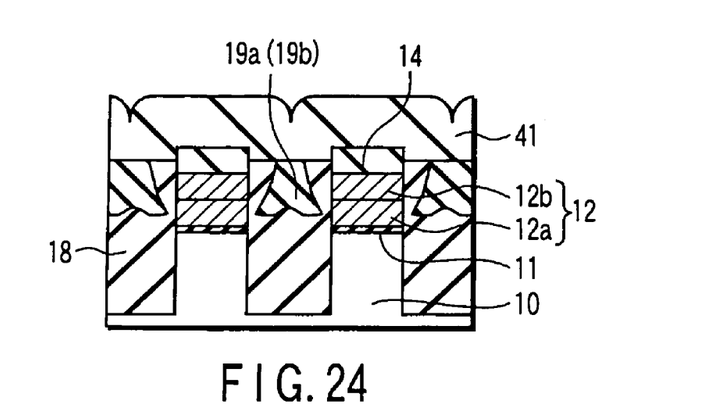
FIGS. 24 and 25 each are a cross sectional view schematically showing a method of manufacturing a remodeled version of the semiconductor device according to the embodiment of the present invention.

First, as shown in FIG. 24, the resultant is subjected to the baking process and is let stand in the step of FIG. 12, and then the upper portion of the polysilazane film 19a is removed by etching. After that, as in a similar manner to that described in the embodiment, water is adhered onto the surface of the stack film of the CVD silicon oxide film 18 and polysilazane film 19a, and further the polysilazane solution layer 41 is formed on the water-adhered stacked film.

Figure 25:
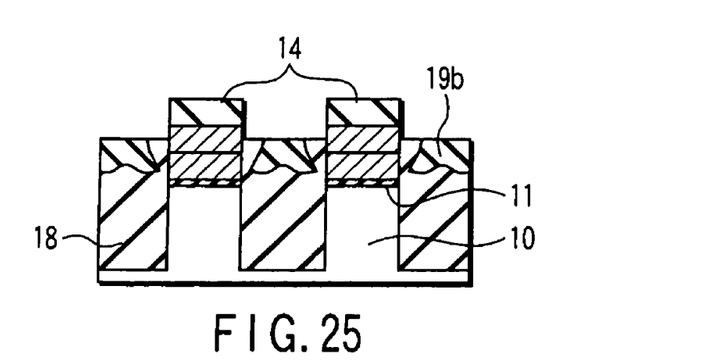

Next, as shown in FIG. 25, as in a similar manner to that described in the embodiment, the polysilazane solution layer 41 is subjected to the baking process to volatilize the solvent, thereby forming the second polysilazane film (not shown). After that, the first polysilazane film 19a and the second polysilazane film are subjected to the curing process and densifying process, thereby obtaining the first polysilazane silicon oxide film 19a and the second polysilazane silicon oxide film (not shown). In this case as well, a granular portion is created in the vicinity of the boundary between the second polysilazane silicon oxide film and the stack film of the CVD silicon oxide film 18 and the first polysilazane silicon oxide film 19b by the same principle described in the embodiment. This granular portion includes silicon oxide that captured carbon atoms contained in the first polysilazane film 19a. In other words, carbon atoms contained in the first polysilazane film 19a can be collected in the vicinity of the boundary between the second polysilazane silicon oxide film and the stack film.

Subsequently, the second polysilazane silicon oxide film, the first polysilazane silicon oxide film 19b and the CVD silicon oxide film 18 are etched back, thereby obtaining a structure as shown in FIG. 25. That is, with this etch-back process, the second polysilazane silicon oxide film is completely removed, and the upper portion of the stack film of the CVD silicon oxide film 18 and the first polysilazane silicon oxide film 19b is removed. As a result, the silicon oxide that captured the carbon atoms, which is formed in the vicinity of the boundary between the second polysilazane silicon oxide film and the stack film is removed at the same time.

Thus, with the method described above, carbon atoms contained in the first polysilazane film 19a can be collected in the vicinity of the boundary between the second polysilazane silicon oxide film and the stack film. With this structure, it is possible to set the carbon atoms contained in the first polysilazane film 19a distant from the surface of the silicon substrate, thereby making it possible to suppress the adverse effect on the semiconductor device by carbon. Further, by removing the silicon oxide in which carbon atoms are captured, the adverse effect on the semiconductor substrate can be further suppressed.

In the above-described method, the adhesion of water is carried out before converting the first polysilazane film 19a into a polysilazane silicon oxide film, but it is alternately possible to carry out the water adhesion process after converting the first polysilazane silicon 19a into the polysilazane silicon oxide film 19b (see FIGS. 13 and 14). The water adhesion process can be carried out after the curing process of the polysilazane film 19a or after the densifying process. In this case as well, carbon atoms contained in the first polysilazane silicon oxide film can be collected in the vicinity of the boundary between the second polysilazane silicon oxide film and the stack film of the CVD silicon oxide film 18 and the first polysilazane silicon oxide film 19b by the same principle described in the embodiment. Therefore, the adverse effect on the semiconductor substrate by carbon can be suppressed in the same manner as that of the before-described method.

The above-described embodiment was described in connection with the case where a stack film of a CVD silicon oxide film and a polysilazane silicon oxide film is formed in an isolation trench, but it is alternatively possible to apply the method described in the embodiment to some other regions than the isolation trench. For example, in the case where an interlayer insulating film is formed on an underlying region having recesses and projections, the above-described method can be applied to form an interlayer insulating film. In this manner, an interlayer insulating film that is fully converted into silicon oxide and has a uniform quality can be formed.

Further, in the above-described embodiment, water is adhered directly onto the surface of the CVD silicon oxide film 18, but it is alternatively possible to first form a thin oxide film having a high water-absorptive property such as a BPSG film on the CVD silicon oxide film 18 and then adhere water onto the CVD silicon oxide film 18 with the thin oxide film.

Furthermore, the above-described embodiment was described in connection with the cases where polysilazene is used as a polymer containing silicon, but it is alternatively possible to use some other polymers as long as they are converted into silicon oxides by a heat process and they easily react with water to produce silicon oxides, for the application of the same method as of the above-described embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a semiconductor substrate including a first upper surface and a trench;
   a gate insulating film formed on the first upper surface;
   a gate electrode formed on the gate insulating film, the gate electrode including a first side surface being flush with a second side surface of the trench;
   a first insulating film containing silicon oxide as a main ingredient, the first insulating film being formed in the trench and on the second side surface, a height of a second upper surface of the first insulating film being lower than a height of a third upper surface of the gate electrode relative to the first upper surface of the semiconductor substrate, the first insulating film including a recess in an upper end portion thereof; and
   a second insulating film containing silicon oxide as a main ingredient and formed in the recess, the second insulating film including a fourth upper surface being flush with the second upper surface of the first insulating film and a granular portion having a carbon, the granular portion located along an interface between the first and second insulating films.

2. The semiconductor device according to claim 1, wherein a carbon concentration of the granular portion is higher than that of an other portion of the second insulating film than the granular portion.

3. The semiconductor device according to claim 1 further comprising a third insulating film formed on the gate electrode, the second upper surface of the first insulating film and the fourth upper surface of the second insulating film, and an additional gate electrode formed on the third insulating film.

4. The semiconductor device according to claim 3, wherein the gate electrode is a floating gate electrode and the additional gate electrode is a control gate electrode.

5. The semiconductor device according to claim 1, wherein the second insulating film includes a bottom surface, a height of the bottom surface is higher than the first upper surface of the semiconductor substrate.

* * * * *